United States Patent
Sharan et al.

[11] Patent Number: 6,054,191
[45] Date of Patent: *Apr. 25, 2000

[54] METHOD OF FORMING AN ELECTRICAL CONTACT TO A SILICON SUBSTRATE

[75] Inventors: Sujit Sharan; Gurtej S. Sandhu, both of Boise, Id.

[73] Assignee: Micron Technology, Inc., Boise, Id.

[*] Notice: This patent is subject to a terminal disclaimer.

[21] Appl. No.: 09/028,689

[22] Filed: Feb. 24, 1998

Related U.S. Application Data

[63] Continuation of application No. 08/587,145, Jan. 16, 1996, Pat. No. 5,747,116, which is a continuation-in-part of application No. 08/506,040, Jul. 24, 1995, Pat. No. 5,661,115, and application No. 08/336,260, Nov. 8, 1994, Pat. No. 5,576,071.

[51] Int. Cl.[7] .............................. C23C 14/02; H05H 1/00
[52] U.S. Cl. .................... 427/534; 427/533; 427/535; 427/255.394; 427/255.7; 438/676; 438/681; 438/675
[58] Field of Search ...................... 427/534, 533, 427/535, 255, 255.1, 255.7, 255.394, 255.11; 438/676, 681, 675

[56] References Cited

U.S. PATENT DOCUMENTS

| | | | |
|---|---|---|---|
| 4,558,509 | 12/1985 | Tiwari | 29/576 B |
| 4,568,565 | 2/1986 | Gupta et al. | 427/53.1 |
| 4,926,237 | 5/1990 | Sun et al. | 357/71 |
| 5,130,172 | 7/1992 | Hicks et al. | 427/252 |
| 5,139,825 | 8/1992 | Gordon et al. | 427/255.2 |
| 5,232,871 | 8/1993 | Ho | 437/190 |
| 5,300,321 | 4/1994 | Nakano et al. | 427/248.1 |
| 5,320,878 | 6/1994 | Maya | 427/573 |
| 5,399,379 | 3/1995 | Sandhu | 427/255.2 |
| 5,403,620 | 4/1995 | Kaesz et al. | 427/252 |
| 5,567,483 | 10/1996 | Foster et al. | 427/535 |
| 5,576,071 | 11/1996 | Sandhu | 427/534 |
| 5,607,722 | 3/1997 | Vaartstra et al. | 427/248 |

FOREIGN PATENT DOCUMENTS

| | | |
|---|---|---|
| 2-19468 | 1/1990 | Japan . |
| 5-234953 | 9/1993 | Japan . |

OTHER PUBLICATIONS

Weber, et al., "Deposition of TiN using tetrakis(dimethylamido)–titanium in an electron–cyclotron–resonance plasma process," Applied Physics Letters, vol. 63 (3), pp. 325–327, No year and month data.

(List continued on next page.)

*Primary Examiner*—Roy V. King
*Attorney, Agent, or Firm*—Wells, St. John, Roberts, Gregory & Matkin

[57] ABSTRACT

A method of forming an electrical contact to a substrate includes, a) placing a substrate having a silicon node to which electrical connection is to be made within a chemical vapor deposition reactor; b) injecting a first titanium organometallic precursor to within the reactor having the substrate positioned therein, and maintaining the reactor at a temperature and a pressure which in combination are effective to deposit a first layer comprising titanium nitride onto the substrate over the node to a first thickness, the first layer of titanium nitride having incorporated carbon from the first titanium organometallic precursor, the first layer and silicon node defaming a contact interface therebetween; c) after depositing the first layer, ceasing to inject the first titanium organometallic precursor into the reactor and first injecting a first component gas into the reactor and generating a first plasma from the first component gas within the reactor against the first layer, the first component gas and first plasma generated therefrom having a component which is effective when in an activated state to interact with a component of the deposited first layer to remove carbon from the first layer; d) after depositing the first layer, exposing an interface of the titanium nitride and silicon node to conditions effective to transform the interface into a lower electrical resistance; e) the "a" and "b" steps can be repeated to provide a second layer atop the first layer.

35 Claims, 1 Drawing Sheet

OTHER PUBLICATIONS

Miemer, Burkhard et al., "Organometallic Chemical Vapor Deposition of Tungsten Metal, And Suppression Of Carbon Incorporation by Codeposition Of Platinum" University of California, Department of Chemical Engineering, Aug. 4, 1992, No page data.

Intemann, et al., "Film Properties of CVD Titanium Nitride Deposited With Organometallic Precursors at Low Pressure Using Inert Gases, Ammonia, or Remote Activation," Journal of the Electrochemical Society, vol. 140, No. 11, pp. 3215–3222, No year and month data.

Conrad, J.R., et al, "Ion Beam Assisted Coating And Surface Modification With Plasma Source Ion Implantation", J.Vac. Sci. Technol. A8 (4), Jul.–Aug. 1990, pp. 3146–3151.

H. Watanabe, et al, "Stacked Capacitor Cells for High Density Dynamic RAM's", IED 1988, pp. 600–603, No month data.

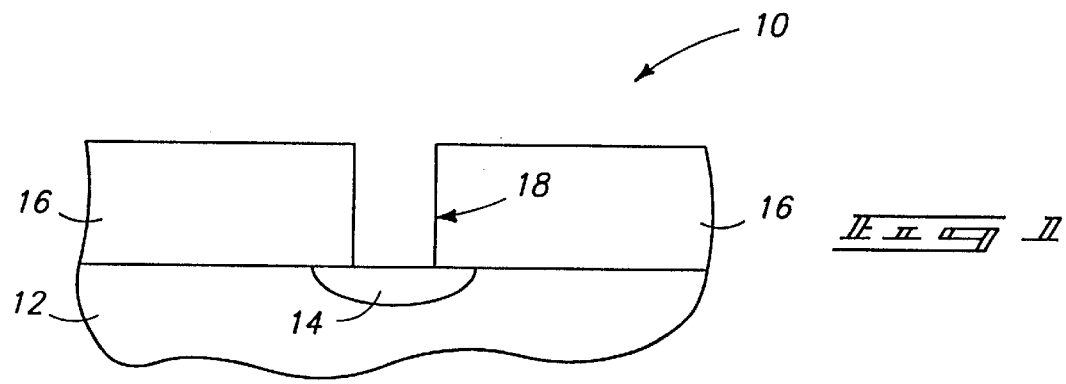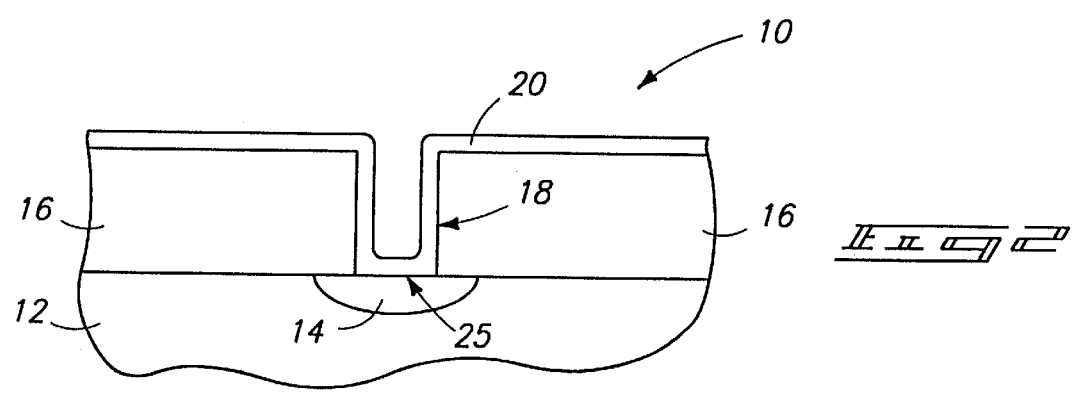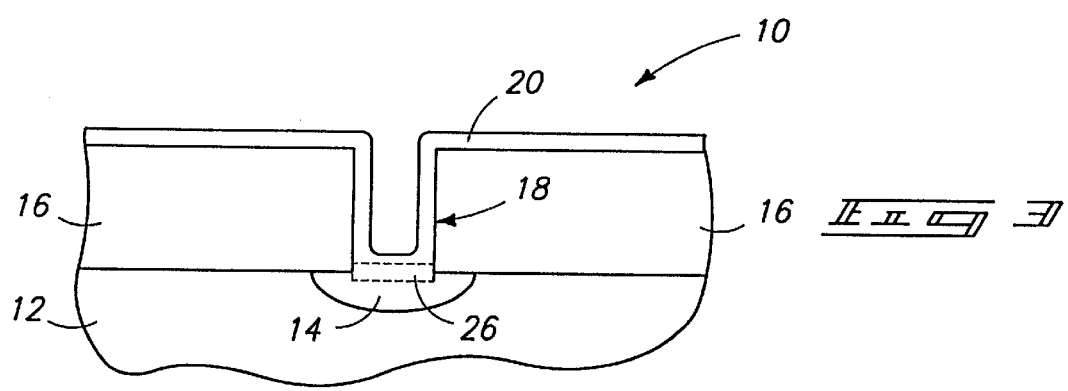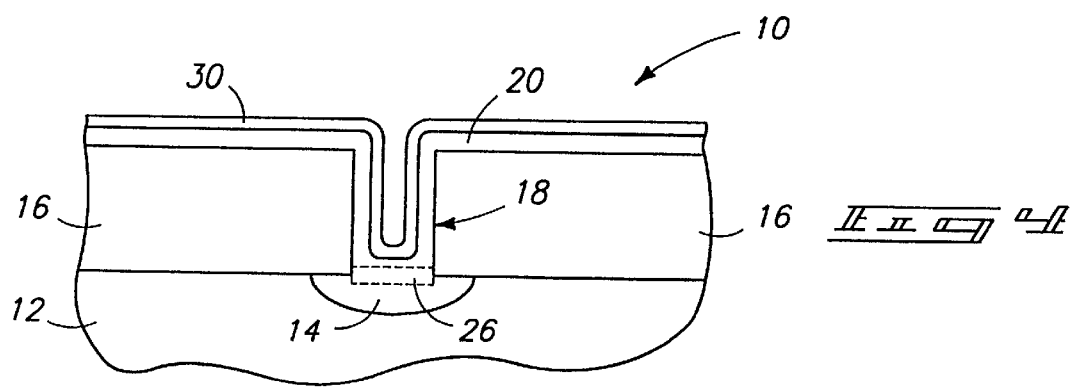

6,054,191

METHOD OF FORMING AN ELECTRICAL CONTACT TO A SILICON SUBSTRATE

RELATED PATENT DATA

This patent is a continuation of U.S. patent application Ser. No. 08/587,145, filed Jan. 16, 1996 and now U.S. Pat. No. 5,747,116, which is a continuation-in-part of U.S. patent application Ser. No. 08/506,040, filed on Jul. 24, 1995 and now U.S. Pat. No. 5,661,115, and U.S. patent application Ser. No. 08/336,260, filed on Nov. 8, 1994 and now U.S. Pat. No. 5,576,071.

BACKGROUND OF THE INVENTION

In the processing of integrated circuits, electric contact must be made to isolated active device regions formed within a wafer substrate typically comprising monocrystalline silicon. The active device regions are connected by high electrically conductive paths or lines which are fabricated above an insulator material, which covers the substrate surface. To provide electrical connection between the conductive path a and active-device regions, an opening in the insulator is provided to enable the conductive films to contact the desired regions. Such openings are typically referred to as contact openings, or simply "contacts".

As transistor active area dimensions approached one micron in diameter, conventional process parameters resulted in intolerable increased resistance between the active region or area and the conductive layer. The principal way of reducing such contact resistance is by formation of a metal silicide atop the active area prior to application of the conductive film for formation of the conductor runner. One common metal silicide material formed is $TiSi_x$, where x is predominantly "2". The $TiSi_x$ material is typically provided by first applying a thin layer of titanium atop the wafer which contacts the active areas within the contact openings. Thereafter, the wafer is subjected to a high temperature anneal. This causes the titanium to react with the silicon of the active area, thus forming the $TiSi_x$. Such a process is said to be self-aligning, as the $TiSi_x$ is only formed where the titanium metal contacts the silicon active regions. The applied titanium film everywhere else overlies an insulative, and substantially non-reactive, $SiO_2$ layer.

Ultimately, an electrically conductive contact filling material such as tungsten would be provided for making electrical connection to the contact. However, tungsten adheres poorly to $TiSi_x$. Additionally, it is desirable to prevent intermixing of the contact filling material with a the silicide and underlying silicon. Accordingly, an intervening layer is typically provided to prevent the diffusion of the silicon and silicide with the plug filling metal, and to effectively adhere the plug filling metal to the underlying substrate. Such material is, accordingly, also electrically conductive and commonly referred to as a "barrier layer" due to the anti-diffusion properties.

One material of choice for use as a glue/diffusion barrier layer is titanium nitride. TiN is an attractive material as a contact diffusion barrier in silicon integrated circuits because it behaves as an impermeable barrier to silicon, and because the activation energy for the diffusion of other impurities is very high. TiN is also chemically thermodynamically very stable, and it exhibits typical low electrical resistivities of the transition metal carbides, borides, or nitrides.

TiN can be provided or formed on the substrate in one of the following manners: a) by evaporating Ti in an $N_2$ ambient; b) reactively sputtering Ti in an Ar and $N_2$ mixture; c) sputtering from a TiN target in an inert (Ar) ambient; d) sputter depositing Ti the titanium metal contacts the silicon active regions. The applied titanium film everywhere else overlies an insulative, and substantially non-reactive, $SiO_2$ layer.

Ultimately, an electrically conductive contact filling material such as tungsten would be provided for making electrical connection to the contact. However, tungsten adheres poorly to $TiSi_x$. Additionally, it is desirable to prevent intermixing of the contact filling material with the silicide and underlying silicon. Accordingly, an intervening layer is typically provided to prevent the diffusion of the silicon and silicide with the plug filling metal, and to effectively adhere the plug filling metal to the underlying substrate. Such material is, accordingly, also electrically conductive and commonly referred to as a "barrier layer" due to the anti-diffusion properties.

One material of choice for use as a glue/diffusion barrier layer is titanium nitride. TiN is an attractive material as a contact diffusion barrier in silicon integrated circuits because it behaves as an impermeable barrier to silicon, and because the activation energy for the diffusion of other impurities is very high. TiN is also chemically thermodynamically very stable, and it exhibits typical low electrical resistivities of the transition metal carbides, borides, or nitrides.

TiN can be provided or formed on the substrate in one of the following manners: a) by evaporating Ti in an $N_2$ ambient; b) reactively sputtering Ti in an Ar and $N_2$ mixture; c) sputtering from a TiN target in an inert (Ar) ambient; d) sputter depositing Ti in an Ar ambient and converting it to TiN in a separate plasma nitridation step; or e) by low pressure chemical vapor deposition.

As device dimensions continue to shrink, adequate step coverage within the contact has become problematical with respect to certain deposition techniques. Chemical vapor deposition is known to deposit highly conformal layers, and would be preferable for this reason in depositing into deep, narrow contacts.

Organic compounds are commonly utilized as chemical vapor deposition precursors. One subclass of this group which is finding increasing use in chemical vapor deposition of metals and metal compounds are organometallic precursors. Specifically, an example is the reaction of a titanium organometaffic precursor of the formula $Ti(N(CH_3)_2)_4$, named tetrakisdimethyl-amidotitanium (TDMAT), and ammonia or nitrogen in the presence of a carrier gas which reacts to produce TiN according to the following formula:

$$Ti(NR_2)_4 + NH_3 \rightarrow TiN + \text{organic by-products}$$

Organometallic compounds contain a central or linking atom or ion (Ti in TDMAT) combined by coordinate bonds with a definite number of surrounding ligands, groups or molecules, at least one of which is organic (the $(N(CH_3)_2$ groups in TDMAT). The central or linking atom as accepted within the art may not be a "metal" in the literal sense. As accepted within the art of organometallic compounds, the linking atom could be anything other than halogens, the noble gases, H, C, N, 0, P, S, Se, and Te.

The above and other chemical vapor deposition reactions involving organometallics are typically conducted at low pressures of less than 1 Torr. It is typically desirable in low pressure chemical vapor deposition processes to operate at as low a pressure as possible to assure complete evacuation of potentially undesirable reactive and contaminating components from the chamber. Even small amounts of these materials can result in a significant undesired increase in resistivity. For example, oxygen incorporation into the film before and after deposition results in higher resistivity. Additionally, it is believed that organic incorporation (specifically pure carbon or hydrocarbon incorporation) into the resultant film reduces density and resistivity. Such organic incorporation can result from carbon radicals from the organic portion of the precursor becoming incorporated into the film, as opposed to being expelled with the carrier gas. Carbon incorporation can also cause other undesired attributes in the deposited film, such as low density and poor long-term reliability.

Hydrogen is a known capable reactant with deposited carbon or metal carbides. Such will react with carbon atoms to form volatile hydrocarbons. Hydrogen atoms, radicals or ions are more reactive than molecular hydrogen in producing volatile hydrocarbons.

It would be desirable to improve upon these and other prior art chemical vapor deposition processes in methods of forming an electrical contact to a silicon substrate.

BRIEF DESCRIPTION OF THE DRAWINGS

Preferred embodiments of the invention are described below with reference to the following accompanying drawings.

FIG. 1 is a diagrammatic sectional view of a semiconductor wafer at one processing step in accordance with the invention.

FIG. 2 is a view of the FIG. 1 wafer at a processing step subsequent to that shown by FIG. 1.

FIG. 3 is a view of the FIG. 1 wafer shown at a processing step subsequent to that shown by FIG. 2.

FIG. 4 is a view of the FIG. 1 wafer shown at a processing step subsequent to that shown by FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming an electrical contact to a substrate includes the following steps:

placing a substrate having a silicon node to which electrical connection is to be made within a chemical vapor deposition reactor;

injecting a first titanium organometallic precursor to within the reactor having the substrate positioned therein, and maintaining the reactor at a temperature and a pressure which in combination are effective to deposit a first layer comprising titanium nitride onto the substrate over the node to a first thickness, the first layer of titanium nitride having incorporated carbon from the first titanium organometallic is precursor, the first layer and silicon node defining a contact interface therebetween having a first electrical resistance;

after depositing the first layer, ceasing to inject the first titanium organometallic precursor into the reactor and first injecting a first component gas into the reactor and generating a first plasma from the first component gas within the reactor against the first layer, the first component gas and first plasma generated therefrom having a component which is effective when in an activated state to interact with a component of the deposited first layer to remove carbon from the first layer; and after depositing the first layer, exposing the interface of the titanium nitride and silicon node to conditions effective to transform such interface to a second electrical resistance which is lower than the first electrical resistance.

Referring to FIG. 1, a semiconductor wafer fragment in process is indicated generally with reference to numeral 10. Such comprises a bulk monocrystalline silicon substrate 12 having a diffusion region 14 provided therein. Diffusion region 14 might constitute, for example, an n-type region having a conductivity dopant concentration of at least $1\times10^{19}$ ions/cm$^3$. Diffusion region 14 constitutes a silicon node to which electrical connection is to be made. An insulating layer 16 is provided over substrate 12, and provided with a contact opening 18 therethrough to node 14.

During processing, a thin layer of oxide typically and undesirably forms atop node 14 within contact opening 18. Such oxide is preferably removed by plasma cleaning within a chemical vapor deposition reactor. Example feed gases for such plasma cleaning is include argon, $H_2$, a mixture of $H_2$ and argon, or a reactive gas such as $NF_3$. Preferably, the substrate is biased at, for example, −100 volts to impart directionality to the ions so as to reach the bottom of contact openings and to cause greater attraction of the plasma to the substrate for such cleaning.

Referring to FIG. 2 and after plasma cleaning of node 14, a first titanium organometallic precursor and a carrier gas are injected to within the reactor, and the reactor is maintained at a temperature and pressure which in combination are effective to deposit a first layer 20 comprising titanium nitride over insulating layer 16 and node 14. Layer 20 is provided to a first thickness which is preferably less than or equal to 100 Angstroms, and more preferably less than or equal to 50 Angstroms. A titanium nitride/silicon interface 25 results at the base of contact opening 18. Interface or contact 25 will have a first electrical resistance which would desirably be very low. However unfortunately, any interface between two discretely deposited or provided conductive materials will have a degree of electrical resistance thereacross. Further, and even with pre-plasma cleaning, some residual oxygen or other contaminant can remain or occur at the interface during deposition.

Example precursors usable in accordance with the invention are a combination of TDMAT with a carrier gas and $N_2$. Preferred pressure is from 0.1 Torr to 10 Torr, with preferred temperature being from 200° C. to 700° C. A specific reduction to practice example temperature and pressure were a wafer carrier temperature of 420° C., and a reactor pressure at 0.5 Torr.

Titanium from the organometallic precursor is intended to combine with the nitrogen to deposit a TiN layer. Undesirably, first titanium nitride layer 20 has incorporated carbon from the titanium organometallic precursor, typically in the form of titanium carbide or hydrocarbons. Such is effectively removed from the layer by an interactive plasma treatment. Specifically, after depositing first layer 20, injection of the first organometallic precursor is ceased, and a first injection of a first component gas into the reactor is conducted. Preferably, a time lag is provided between ceasing the injection of the first titanium organometallic precursor and the injection of the first component gas, with an example and preferred time lag being five seconds. Within the reactor, a first plasma is generated from the first component gas against first layer 20. The substrate is preferably biased at a negative voltage (i.e., −100 Volts) during the reactive plasma treatment to attract ions against the substrate. An example reduction-to-practice plasma density of $10^8$ to $10^9$ ions/cm$^3$ was utilized. High density plasma (i.e., $10^{11}$ to $10^{13}$ ionslcm$^3$) may also be employed to obtain a higher density of ions at lower process pressures. Such will facilitate ion bombardment as well as removal of carbon-containing reaction byproducts from the surface of the film.

In accordance with the earliest parent patent application disclosure, the component gas had to at least comprise hydrogen atoms and interact by chemical interaction for purposes of carbon removal. In accordance with this continuation-in-part disclosure, the first component gas does not necessarily comprise hydrogen atoms and does not require chemical interaction in the literal sense. Yet, the first component gas need contain some component which is effective when in an activated state to interact with a component of deposited first layer 20. In one preferred embodiment, this activated state component effectively diffuses into the first layer and interacts with the deposited first layer component to remove carbon from the first layer and produce gaseous products which are expelled from the reactor. Carbon incorporation in the resultant film is thus minimized. Also, the deposited first layer component might comprise unbonded and incomplete electron shell carbon atoms. The activated state component in this example would chemically react with the unbonded and incomplete electron shell atoms to drive carbon from the film.

By way of example, the component gas might consist essentially of $N_2$. If the deposited film comprises undesired TiC (and also perhaps hydrocarbons), the nitrogen plasma presents a component (atomic or ionic nitrogen) against the deposited film. This component is chemically reactive with a component of the deposited film (carbon) to remove or displace carbon from such film, and produce gaseous products (i.e., CN compounds) which are expelled from the reactor. The goal or intent with this example is to initially provide a gas which has some chemically reactive component which breaks a bond within the deposited film to cause carbon (in any of atomic, radical, or molecular radical form) to be displaced from the film and out of the reactor. The component from the gas might remain in the deposited film, combine with the displaced carbon and exit the reactor, or singularly exit the reactor without combining with carbon or other material of the deposited film. Also in this example, $H_2$ might be combined with the $N_2$ gas.

In the above nitrogen example, atomic N functions as a non-metallic bonding component to the metallic Ti, and results in conductive TiN. As another alternative, the component gas might consist essentially of hydrogen, or a combination of two or more reactive components. $NH_3$ is an example of a single component and chemically reactive gas which can present multiple components (N atoms and H atoms) which are separately reactive with components of the example TiN deposited films. Some of the N atoms would become incorporated into the film in place of the displaced carbon, while the H atoms would most likely combine with the displaced carbon to form stabilized hydrocarbons which are predominately expelled from the reactor. An example RF power range for plasma treatment is from 50 to 1,000 W.

As an alternate example, the component gas might consist essentially of elemental Ar. The interaction for carbon removal in this and the above examples may be chemical, physical or a combination of both. The plasma argon ions would bombard the deposited film and react or impinge upon unbonded and incomplete electron shell carbon atoms to effectively drive carbon from the film. Carbon remaining deeper within the film would then outwardly diffuse to be impinged upon by more argon plasma, and be displaced from the film.

Also, the deposition to produce layer 20 could be conducted with or without plasma enhancement, while the ion bombardment of the first plasma treatment will always involve plasma in accordance with this invention. Preferably, the time treatment for plasma bombardment is significantly greater (i.e., at least two times greater) than the time period for the deposition to produce layer 20.

Ideally during this first plasma treatment, titanium nitride/ silicon node interface 25 is effectively subjected to conditions which are effective to transform interface 25 to a second electrical resistance with is lower than the first electrical resistance. For example where interface 25 includes an oxide, elevated temperature exposure of interface 25 can be utilized to break-up the oxide to provide Ti or TiN to extend therethrough to the node and thereby reduce contact resistance. Alternately by way of example only, interface 25 might be exposed to an effective elevated temperature after the first plasma treatment to impart such lower electrical resistance. An example elevated temperature is 500° C. or greater. Further and alternately, the effective temperature exposure can be utilized to effectively transform interface 25 into a titanium silicide junction 26 to the substrate, which will inherently provide a lower resistance contact. (See FIG. 3). In such event, the transformation to titanium silicide preferably consumes less than or equal to one-half of the first thickness of first layer 20 over node 14.

Referring to FIG. 4, a second layer 30 of titanium nitride having a preferred thickness of greater than or equal to 150 Angstroms is provided atop layer 20. A preferred method for providing such layer is again by repeating the injection of a second titanium organometallic precursor, preferably the same precursor, and carrier gas effective to deposit a thicker second layer 30 comprising titanium nitride. Such technique will again produce a titanium nitride layer having incorporated carbon from the second titanium organometallic precursor, typically in the form of hydrocarbon and/or titanium carbide. Subsequent to such deposition, a second plasma is generated from a second component gas, preferably the same as the first component gas, within the chemical vapor deposition reactor and against second layer 30. The second plasma will effectively function the same as the first plasma to displace carbon from such layer and produce gaseous products which are expelled from the reactor.

The FIG. 4 construction might then be provided with a conductive plug-filling material to complete filling of contact 18, and then be polished or otherwise planarized back. Alternately, titanium nitride layer 30 might be deposited to be sufficiently thick to effectively fill and completely plug contact opening 18.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an electrical contact to a substrate comprising:

forming a layer over a silicon-comprising node, the layer comprising titanium nitride having carbon incorporated therein, the layer and silicon-comprising node defining a contact interface therebetween having a first electrical resistance;

after forming the layer, exposing the interface of the titanium nitride and silicon-comprising node to conditions effective to transform such interface to a second electrical resistance which is lower than the first electrical resistance; and treating the layer with a plasma to remove carbon from the layer, the plasma having a component which is effective when in an activated state to interact with a component of the layer to remove carbon.

2. The method of claim 1 wherein the interface exposing and the plasma treating step are conducted together.

3. The method of claim 1 wherein the interface exposing transforms the interface into titanium silicide.

4. A method of forming an electrical contact to a substrate comprising:

forming a first layer over a silicon-comprising node, the first layer comprising titanium nitride having carbon incorporated therein, the first layer and silicon-comprising node defining a contact interface therebetween having a first electrical resistance;

after forming the first layer, exposing the interface of the titanium nitride and silicon-comprising node to conditions effective to transform such interface to a second electrical resistance which is lower than the first electrical resistance;

treating the first layer with a first plasma to remove carbon from the first layer, the first plasma having a component which is effective when in an activated state to interact with a component of the first layer to remove carbon;

forming second layer over the plasma-treated first layer, the second layer comprising titanium nitride having carbon incorporated therein; and treating the second layer with a second plasma to remove carbon from the second layer, the second plasma having a component which is effective when in an activated state to interact with a component of the second layer to remove carbon.

5. The method of claim 4 wherein the activated state component of the first plasma effectively diffuses into the first layer and interacts with the first layer component to remove carbon from the first layer.

6. The method of claim 4 wherein the activated state component of the first plasma comprises a component which is chemically reactive with the first layer component, the activated state component effectively diffusing into the first layer and chemically reacting with the first layer component to remove carbon from the first layer.

7. The method of claim 4 wherein the first and second plasma components are the same.

8. The method of claim 4 wherein the interface exposing and the first plasma treating are conducted together.

9. The method claim 4 wherein the interface exposing transforms the interface into titanium silicide.

10. The method of claim 4 wherein the interface exposing transforms the interface into titanium silicide, the exposing transforming less than or equal to one half of a thickness of the first layer to titanium silicide.

11. A method of forming an electrical contact to a substrate comprising the following steps:

providing a substrate having a silicon node to which electrical connection is to be made within a chemical vapor deposition reactor;

chemical vapor depositing a first layer comprising titanium nitride onto the substrate over the node to a first thickness, the first layer of titanium nitride having incorporated carbon therein, the first layer and silicon node defining a contact interface therebetween having a first electrical resistance;

after depositing the first layer, injecting a first component gas into the reactor and generating a first plasma from the first component gas within the reactor against the first layer, the first component gas and first plasma generated therefrom having a component which is effective when in an activated state to interact with a component of the deposited first layer to remove carbon;

after depositing the first layer, exposing the interface of the titanium nitride and silicon node to conditions effective to transform such interface to a second electrical resistance which is lower than the first electrical resistance;

after the first plasma treatment, depositing a second layer comprising titanium nitride over the first layer to a second thickness, the second layer of titanium nitride having incorporated carbon therein; and after depositing the second layer, injecting a second component gas into the reactor and generating a second plasma from the second component gas within the reactor and against the second layer, the second component gas and second plasma generated therefrom having a component which is effective when in an activated state to interact with a component of the deposited second layer to remove carbon.

12. The method of forming an electrical contact to a substrate of claim 11 wherein the activated state component effectively diffuses into the first layer and interacts with the deposited first layer component to remove carbon from the first layer.

13. The method of forming an electrical contact to a substrate of claim 11 wherein the activated state component comprises a component which is chemically reactive with the first layer component, the activated state component effectively diffusing into the first layer and chemically reacting with the deposited first layer component to remove carbon from the first layer.

14. The method of forming an electrical contact to a substrate of claim 11 wherein the second thickness is greater than the first thickness.

15. The method of forming an electrical contact to a substrate of claim 11 wherein the first thickness is less than or equal to 100 Angstroms.

16. The method of forming an electrical contact to a substrate of claim 11 wherein the first thickness is less than or equal to 50 Angstroms.

17. The method of forming an electrical contact to a substrate of claim 11 wherein the second thickness is greater than or equal to 150 Angstroms.

18. The method of forming an electrical contact to a substrate of claim 11 wherein the first thickness is less than or equal to 100 Angstroms, and the second thickness is greater than or equal to 150 Angstroms.

19. The method of forming an electrical contact to a substrate of claim 11 wherein the first thickness is less than or equal to 50 Angstroms, and the second thickness is greater than or equal to 150 Angstroms.

20. The method of forming an electrical contact to a substrate of claim 11 wherein the interface exposing step and the first plasma treating step are conducted in the same step.

21. The method of forming an electrical contact to a substrate of claim 11 wherein the interface exposing step and the first plasma treating step are conducted in the same step; and the second thickness is greater than the first thickness.

22. The method of forming an electrical contact to a substrate of claim 11 wherein the interface exposing step and the first plasma treating step are conducted in the same step; and the first thickness is less than or equal to 100 Angstroms.

23. The method of forming an electrical contact to a substrate of claim 11 wherein the interface exposing step transforms the interface into titanium silicide.

24. The method of forming an electrical contact to a substrate of claim 11 wherein the interface exposing step transforms the interface into titanium silicide, the exposing step transforming less than or equal to one half of the first thickness of the first layer over the node to titanium silicide.

25. The method of forming an electrical coctact to a substrate of claim 11 wherein the interface exposing step transforms the interface into titanium silicide, the exposing step and the first plasma treating step being conducted in the same step, and the exposing step transforming less than or equal to one half of the first thickness of the first layer over the node to titanium silicide.

26. The method of forming an electrical contact to a substrate of claim 11 wherein the first and second component gases comprise hydrogen and nitrogen atoms.

27. The method of forming an electrical contact to a substrate of claim 11 further comprising plasma cleaning the node prior to provision of the first layer.

28. A method of forming an electrical contact to a substrate comprising the following steps:

placing a substrate having a silicon node to which electrical connection is to be made within a chemical vapor deposition reactor;

depositing a layer comprising titanium nitride onto the substrate over the node to a first thickness, the layer of titanium nitride having incorporated carbon therein, the layer and silicon node defining a contact interface therebetween having a first electrical resistance;

after depositing the layer, injecting a component gas into the reactor and generating a plasma from the component gas within the reactor and against the layer, the component gas and plasma generated therefrom having a component which is effective when in an activated state to interact with a component of the deposited layer to remove carbon; and after depositing the layer, exposing the interface of the titanium nitride and silicon node to conditions effective to transform such interface to a second electrical resistance which is lower than the first electrical resistance.

29. The method of forming an electrical contact to a substrate of claim 28 wherein the first thickness is less than or equal to 100 Angstroms.

30. The method of forming an electrical contact to a substrate of claim 28 wherein the first thickness is less than or equal to 50 Angstroms.

31. The method of forming an electrical contact to a substrate of claim 28 wherein the interface exposing step and the plasma treating step are conducted in the same step.

32. The method of forming an electrical contact to a substrate of claim 28 wherein the interface exposing step transforms the interface into titanium silicide.

33. The method of forming an electrical contact to a substrate of claim 28 wherein the interface exposing step transforms the interface into titanium silicide, the exposing step transforming less than or equal to one half of the first thickness of the layer to titanium silicide.

34. The method of forming an electrical contact to a substrate of claim 28 wherein the interface exposing step transforms the interface into titanium silicide, the exposing step and the plasma treating step being conducted in the same step, and the exposing step transforming less than or equal to one half of the first thickness of the layer to titanium silicide.

35. A method of forming an electrical contact to a substrate comprising the following steps:

placing a substrate having a silicon node to which electrical connection is to be made within a chemical vapor deposition reactor, the substrate comprising bulk monocrystalline silicon and the node comprising a diffusion region;

injecting a first titanium organometallic precursor to within the reactor having the substrate positioned therein, and maintaining the reactor at a temperature and a pressure which in combination are effective to deposit a first layer comprising titanium nitride onto the substrate over the node to a first thickness, the first layer of titanium nitride having incorporated carbon from the first titanium organometallic precursor, the first layer and silicon node defining a contact interface therebetween having a first electrical resistance;

after depositing the first layer, ceasing to inject the first titanium organometallic precursor into the reactor and first injecting a first component gas into the reactor and generating a first plasma from the first component gas within the reactor against the first layer, the first component gas and first plasma generated therefrom having a component which is effective when in an activated state to interact with a component of the deposited first layer to remove carbon from the first layer;

after depositing the first layer, exposing the interface of the titanium nitride and silicon node to conditions effective to transform such interface to a second electrical resistance which is lower than the first electrical resistance;

after the first plasma treatment, injecting a second titanium organometallic precursor to within the reactor, and maintaining the reactor at a temperature and a pressure which in combination are effective to deposit a second layer comprising titanium nitride over the first layer to a second thickness, the second layer of titanium nitride having incorporated carbon from the second titanium organometallic precursor; and after depositing the second layer, ceasing to inject the second titanium organometallic precursor into the reactor and second injecting a second component gas into the reactor and generating a second plasma from the second component gas within the reactor against the first layer, the second component gas and second plasma generated therefrom having a component which is effective when in an activated state to interact with a component of the deposited second layer to remove carbon from the second layer.

* * * * *

UNITED STATES PATENT AND TRADEMARK OFFICE
CERTIFICATE OF CORRECTION

PATENT NO : 6,054,191
DATED : April 25, 2000
INVENTOR(S) : Sujit Sharan et al.

It is certified that error appears in the above-identified patent and that said Letters Patent are hereby corrected as shown below:

On title page, item 57 Abstract
  replace "defaming"
  with --defining--.
Col. 1, line 12, add --TECHNICAL FIELD  This invention concerns methods of forming an electrical contact to a silicon substrate.--

Col. 1, line 21
  replace "ductive path a"
  with --ductive path--.
Col. 2, line 46
  replace "organometaffic"
  with --organometallic--.
Col. 9, line 14
  replace "coctact"
  with --contact--.
Col. 1, line 48
  replace "with a the silicide"
  with --with the silicide--.

Signed and Sealed this

Tenth Day of April, 2001

*Attest:*

NICHOLAS P. GODICI

*Attesting Officer*     Acting Director of the United States Patent and Trademark Office